(12) United States Patent
Bian

(10) Patent No.: US 10,475,893 B2
(45) Date of Patent: Nov. 12, 2019

(54) TRENCH GATE LEAD-OUT STRUCTURE AND MANUFACTURING METHOD THEREFOR

(71) Applicant: CSMC TECHNOLOGIES FAB2 CO., LTD., Jiangsu (CN)

(72) Inventor: Zheng Bian, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/064,522

(22) PCT Filed: May 26, 2017

(86) PCT No.: PCT/CN2017/086136
§ 371 (c)(1),
(2) Date: Jun. 21, 2018

(87) PCT Pub. No.: WO2017/206812
PCT Pub. Date: Dec. 7, 2017

(65) Prior Publication Data
US 2019/0027564 A1  Jan. 24, 2019

(30) Foreign Application Priority Data

May 31, 2016  (CN) .......................... 2016 1 0378876

(51) Int. Cl.
*H01L 29/423* (2006.01)
*H01L 29/06* (2006.01)
(Continued)

(52) U.S. Cl.
CPC ...... *H01L 29/4236* (2013.01); *H01L 29/0649* (2013.01); *H01L 29/423* (2013.01);
(Continued)

(58) Field of Classification Search
CPC ............. H01L 29/4236; H01L 29/0649; H01L 29/423; H01L 29/42376; H01L 29/66734;
(Continued)

(56) References Cited

U.S. PATENT DOCUMENTS

2007/0023828 A1* 2/2007 Kawamura ......... H01L 29/4236
257/330
2010/0072543 A1* 3/2010 Hsieh .................. H01L 29/4925
257/331
(Continued)

FOREIGN PATENT DOCUMENTS

| CN | 103426925 A | 12/2013 |
|---|---|---|
| CN | 204102904 U | 1/2015 |
| CN | 104821333 A | 8/2015 |

OTHER PUBLICATIONS

International Search Report with English translation dated Sep. 12, 2017 issued in corresponding International Application No. PCT/CN2017/086136, pp. 1-8.

*Primary Examiner* — Sitaramarao S Yechuri
(74) *Attorney, Agent, or Firm* — Polsinelli PC

(57) ABSTRACT

A trench gate lead-out structure comprises a substrate (10), a trench formed in the surface of the substrate (10) and a first dielectric layer (22) on the substrate (10), and also comprises a polysilicon gate (31) at the inner surface of the trench. The trench is partially filled by the polysilicon gate (31), so that a recess exists in the trench above the polysilicon gate (31). A second dielectric layer (41) is filled in the recess. The trench gate lead-out structure also comprises a metal plug (50). The metal plug (50) downwards penetrates through the first dielectric layer (22) and then is inserted between the second dielectric layer (41) and the polysilicon gate (31), and accordingly is connected to the polysilicon gate (31).

10 Claims, 10 Drawing Sheets

(51) Int. Cl.
*H01L 29/66* (2006.01)
*H01L 29/78* (2006.01)
(52) U.S. Cl.
CPC .. *H01L 29/42376* (2013.01); *H01L 29/66734* (2013.01); *H01L 29/7813* (2013.01); *H01L 29/66704* (2013.01); *H01L 29/78* (2013.01); *H01L 29/7825* (2013.01)
(58) Field of Classification Search
CPC ........... H01L 29/7813; H01L 29/66704; H01L 29/78; H01L 29/7825
See application file for complete search history.

(56) References Cited

U.S. PATENT DOCUMENTS

2012/0211891 A1* 8/2012 Vogl .................... H01L 23/4824
257/773
2013/0175574 A1* 7/2013 Matsuura .......... H01L 29/66348
257/139

* cited by examiner

TRENCH GATE LEAD-OUT STRUCTURE AND MANUFACTURING METHOD THEREFOR

CROSS REFERENCE TO RELATED APPLICATIONS

This application is a National Phase filing under 35 U.S.C. § 371 of PCT/CN2017/086136 filed on May 26, 2017, and this application claims priority to Chinese Application No. 201610378876.9 filed on May 31, 2016, under 35 U.S.C. § 119. The entire contents of each application are hereby incorporated by reference in its entirety.

TECHNICAL FIELD

The present disclosure relates to semiconductor manufacturing technology, and particularly relates to a trench gate lead-out structure, and relates to a method of manufacturing a trench gate lead-out structure.

BACKGROUND

Due to cost reasons, a conventional vertically double diffused metal-oxide-semiconductor field-effect transistor (VDMOS) product has an end portion size with enlarged lead-out trenches, and the trench gate is led out via punching a contact hole thereon. The advantage of the solution is that it can use the existing mask layers of the product process, without increasing the cost of mask layers. However, the disadvantage is that the greater size of the end portion of the lead-out trench, the thicker polysilicon to be deposited, resulting in an increase in cost, thus the application of this conventional solution is limited.

SUMMARY

Accordingly, it is necessary to provide a trench gate lead-out structure and a manufacturing method thereof to address the problem of the increasing cost due to a thicker deposited polysilicon in large-sized trench gate.

A trench gate lead-out structure, includes a substrate, a trench on a surface of the substrate, a first dielectric layer located on the substrate, and the trench gate lead-out structure further includes a gate oxide layer located on an inner surface of the trench, and a polysilicon gate located on the gate oxide layer. The trench is partially filled with the polysilicon gate, such that a recess is formed on a surface of the polysilicon gate, and a second dielectric layer is filled in the recess. The trench gate lead-out structure further includes a metal plug extending downwardly through the first dielectric layer and being inserted between the second dielectric layer and the polysilicon gate, such that the metal plug is connected to the polysilicon gate.

A method of manufacturing a trench gate lead-out structure includes: forming a trench on a surface of a substrate, forming a gate oxide layer on an inner surface of the trench; filling the inner surface of the trench with polysilicon without completely filling up the trench, forming a recess on a surface of the polysilicon in the trench; forming an insulating dielectric on the substrate and the trench; photoetching and etching the insulating dielectric to form a dielectric hole, thereby exposing the polysilicon of a side wall of the trench, and dividing the insulating dielectric into a first dielectric layer on the substrate and a second dielectric layer in the trench; performing a contact hole etch to partially remove the polysilicon surrounding the second dielectric layer, and forming a gap between the second dielectric layer and the polysilicon on both sides thereof; and performing a contact hole filling to fill a metal into the dielectric hole and the gap, and forming a metal plug connected to a polysilicon gate.

In the aforementioned trench gate lead-out structure and the manufacturing method thereof, it is not required to completely fill up the trench with the polysilicon gate, and the thickness of the deposited polysilicon is only related to the given width of the cell trench, therefore the thickness is significantly reduced, the product capacity of polysilicon deposition is improved, and the cost is reduced.

BRIEF DESCRIPTION OF THE DRAWINGS

Further objects, characteristics and advantages of present disclosure will become apparent from the detailed description of preferred embodiments illustrated in accompanying drawings. The use of the same reference numbers in different instances in the drawings may indicate identical items, and the drawings are not intended to be drawn to scale, with emphasis on illustrating the subject matter of the present disclosure.

DETAILED DESCRIPTION OF THE EMBODIMENTS

Embodiments of the present disclosure are described more fully hereinafter with reference to the accompanying drawings. A preferred embodiment is described in the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "left", "right" and the like are merely for the illustrative purpose.

Figure 1:
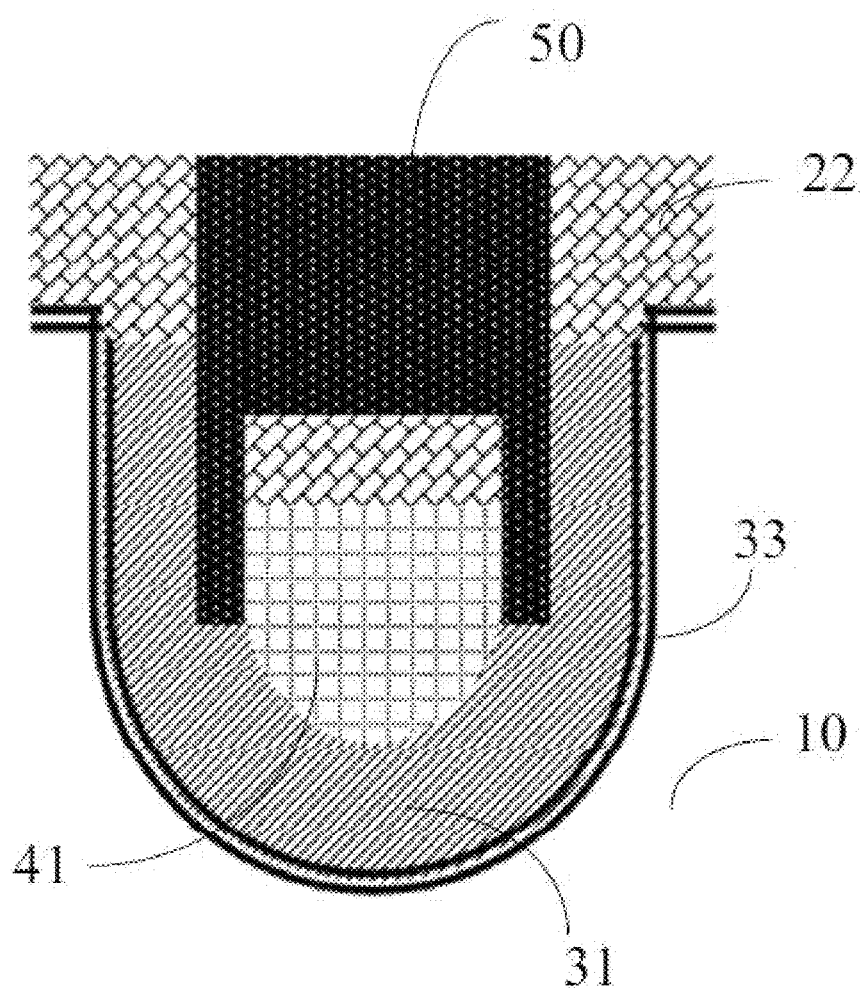
FIG. 1 is a cross-sectional view of a trench gate lead-out structure according to an embodiment.

FIG. 1 is a cross-sectional view of a trench gate lead-out structure according to an embodiment. It includes a substrate 10 (indicated as a blank area in the figure), a trench located on a surface of the substrate 10 (not labeled), a first dielectric layer 22 located on the substrate 10, a gate oxide layer 33 located on an inner surface of the trench, a polysilicon gate 31 located on the gate oxide layer 33, a second dielectric layer 41 located in the trench and half surrounded by the polysilicon gate 31, and a metal plug 50 extending downwardly through the first dielectric layer 22 and being inserted between the second dielectric layer 41 and the polysilicon gate 31, such that the metal plug is connected to the polysilicon gate 31. Specifically, the trench is partially filled with the polysilicon gate 31, therefore a recess recessed along with the trench is formed on the surface of the polysilicon gate 31, and the second dielectric layer 41 is filled in the recess. As shown in FIG. 1, an upper portion and a lower portion of the second dielectric layer 41 are illustrated with different filling patterns, however, in certain embodiments, the upper portion and the lower portion of the second dielectric layer 41 can be of a same material and can be deposited and formed in the same step, which will be described in detail in the method of manufacturing below.

In the aforementioned trench gate lead-out structure, it is not required to completely fill up the trench with the polysilicon gate 31, and the thickness of the deposited polysilicon is only relates to the given width of the cell trench, therefore the thickness is significantly reduced, the product capacity of polysilicon deposition is improved, and the cost is reduced.

It will be understood that the aforementioned trench gate lead-out structure is particularly suitable for a wider trench, therefore the line width requirement for a hole level can be loosened. A photoetching can be performed using a general i-line device instead of a DUV (deep ultraviolet) device, so as to reduce the production cost.

The metal plug 50 has a structure contacting a side surface of the polysilicon gate 31, therefore the contacting surface of metal plug 50 is greater, the corresponding contact resistance is less, and the conduction is more reliable.

One disadvantage of the conventional structure is that, for a trench sizes that meets certain conditions, the contact hole can easily penetrates through an end portion of the trench (i.e. penetrates the polysilicon gate). In the aforementioned trench gate lead-out structure, the second dielectric layer 41 is formed in the polysilicon gate 31 and can serve as a blocking layer during etching the contact hole on the polysilicon, therefore the polysilicon gate 31 cannot be easily etched through.

In the embodiment illustrated in FIG. 1, the polysilicon gate 31 located in the trench has a cross-section of a U-shaped structure, and the second dielectric layer 41 is filled in a concave hollow portion of the U-shaped structure.

In one of the embodiments, the metal plug 50 is a tungsten plug. In other embodiments, other metals known in prior art can also be used to fill the contact hole.

In one of the embodiments, the second dielectric layer 41 is a silicon dioxide layer deposited using tetraethyl orthosilicate (TEOS) as a reactant. In other embodiments, the second dielectric layer 41 can also be formed of other insulating materials, such as phosphosilicate glass (PSG)/boron-doped phosphosilicate glass (BPSG), silicon oxynitride, silicon nitride, and the like.

The aforementioned trench gate lead-out structure is particularly suitable for a DMOS device (including VDMOS and LDMOS). It is to be understood that the trench gate lead-out structure is also suitable for other semiconductor devices.

Figure 2:
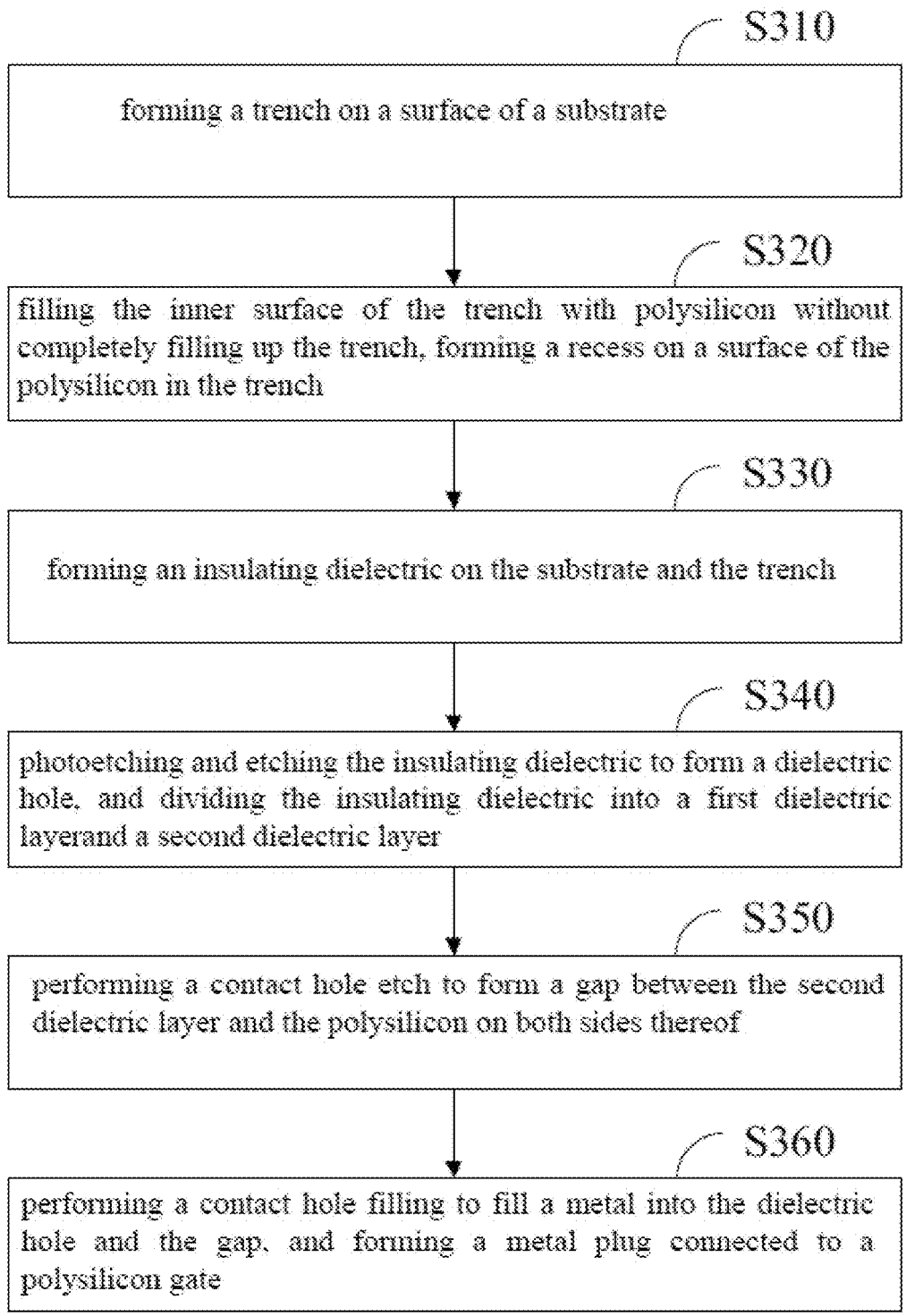
FIG. 2 is a flow chart of a method of manufacturing a trench gate lead-out structure according to an embodiment.

FIG. 2 is a flow chart of a method of manufacturing a trench gate lead-out structure according to an embodiment, including following steps:

S310, a trench is formed on a surface of a substrate.

The trench is formed on a surface of a wafer substrate via etching.

S320, the inner surface of the trench is filled with polysilicon without completely filling up the trench, and a recess on a surface of the polysilicon in the trench is formed.

Figure 3:
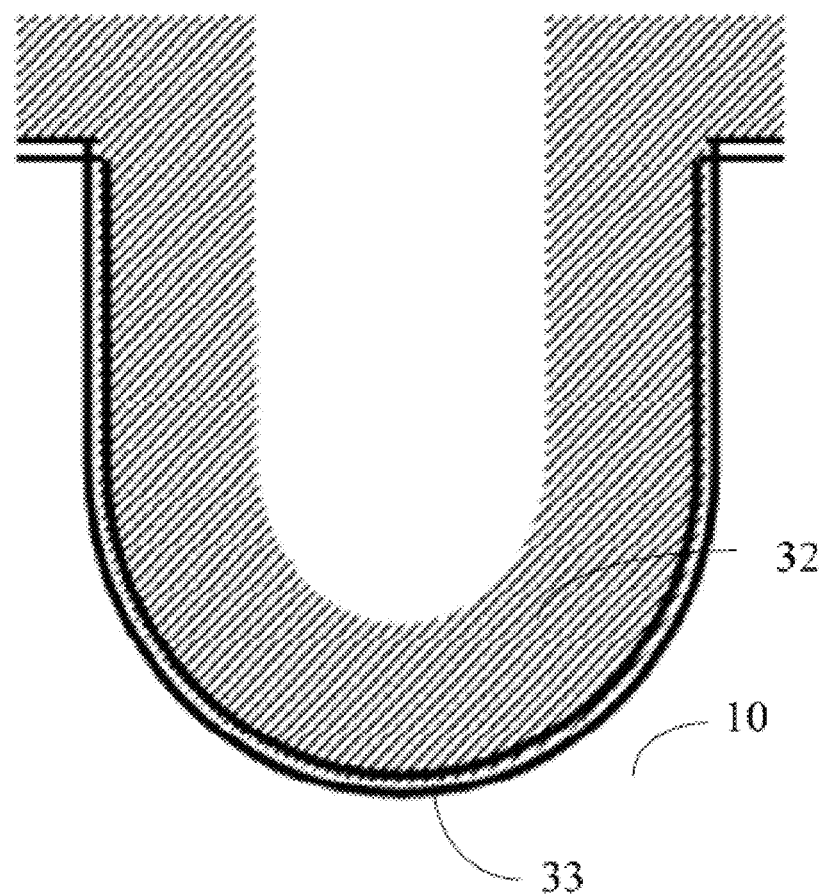
FIG. 3 is a cross-sectional view of a device after step S320 is completed according to an embodiment.

The polysilicon is filled via a deposition process, and the inner surface of the trench is filled with a layer of polysilicon without being completely filled up, therefore a recess is naturally formed. FIG. 3 shows a cross-sectional view of the device after step S320, and the polysilicon layer 32 in the trench has a cross-section of U-shaped structure. It is to be understood that if the polysilicon is directly deposited (i.e. no mask is used), the polysilicon layer may also be formed on a portion of the substrate 10 outside the trench, but the polysilicon outside the trench is unnecessary to the polysilicon gate. If a mask or a blocking layer is formed via photoetching, the polysilicon can be deposited in the trench only, however, this usually results in an increase in cost.

In the illustrate embodiment, a step of forming a gate oxide layer 33 on the surface of the trench is further included between the steps S310 and S320. The polysilicon layer 32 is deposited on the gate oxide layer 33. The gate oxide layer can be formed via a well-known process, such as forming a gate oxide layer via thermal oxidation.

S330, an insulating dielectric is formed on the substrate and the trench.

Figure 4A:
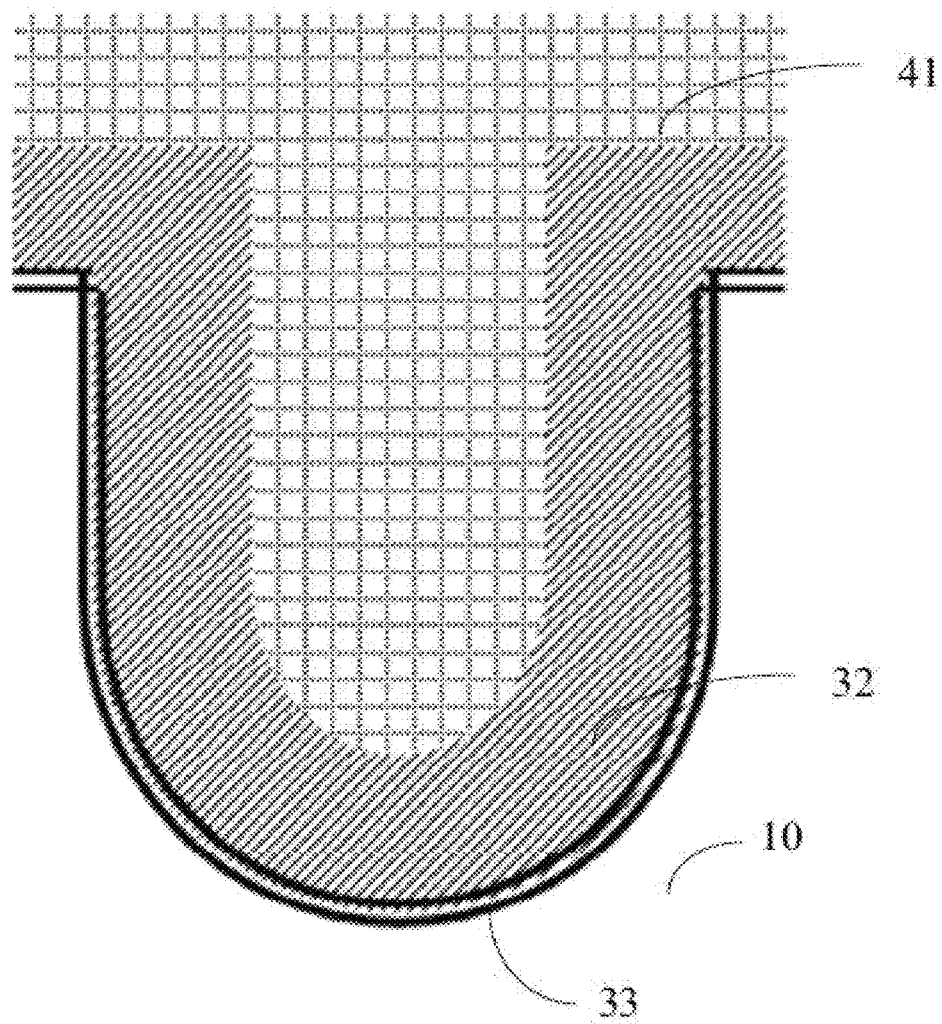
FIG. 4*a* to FIG. 4*d* are a cross-sectional views of a device after steps S332 to S338 are completed according to an embodiment, respectively.
Figure 4B:
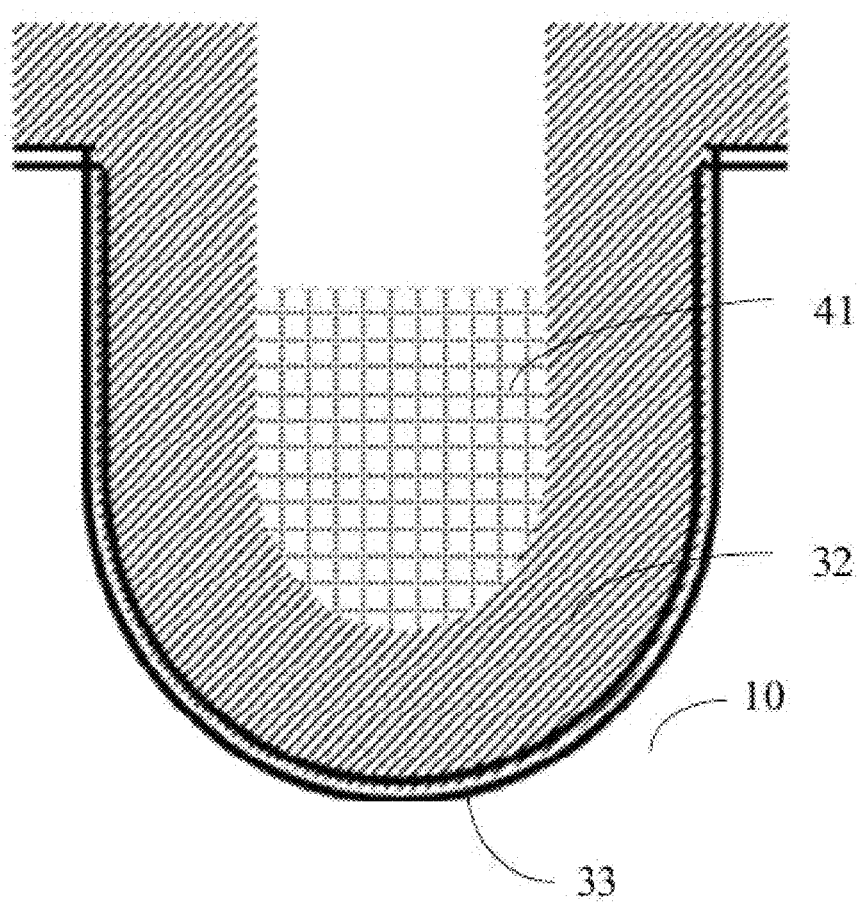
Figure 4C:
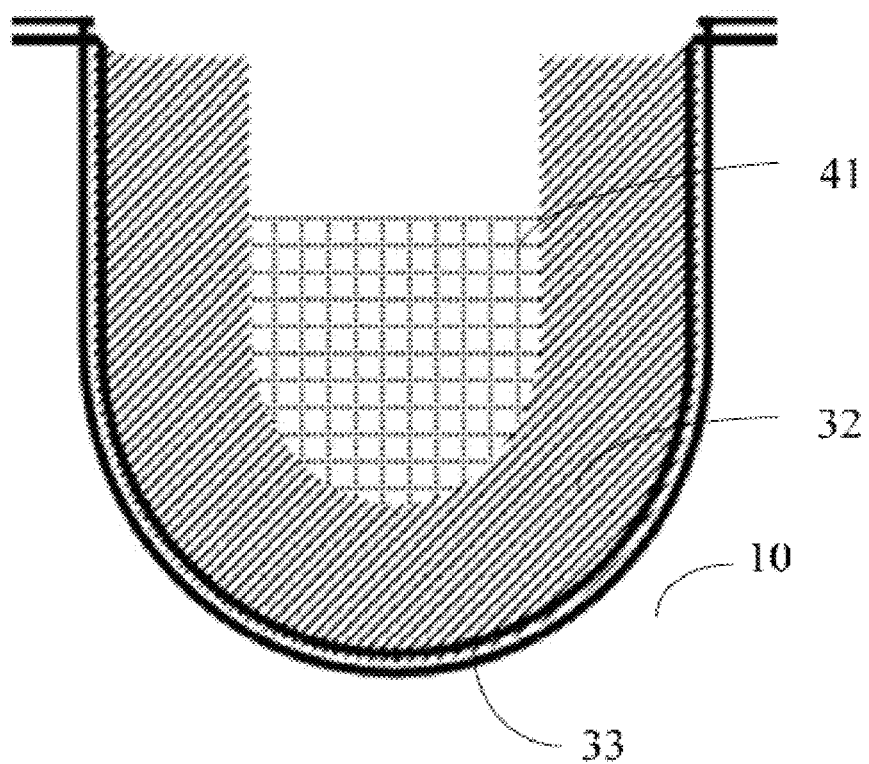
Figure 4D:
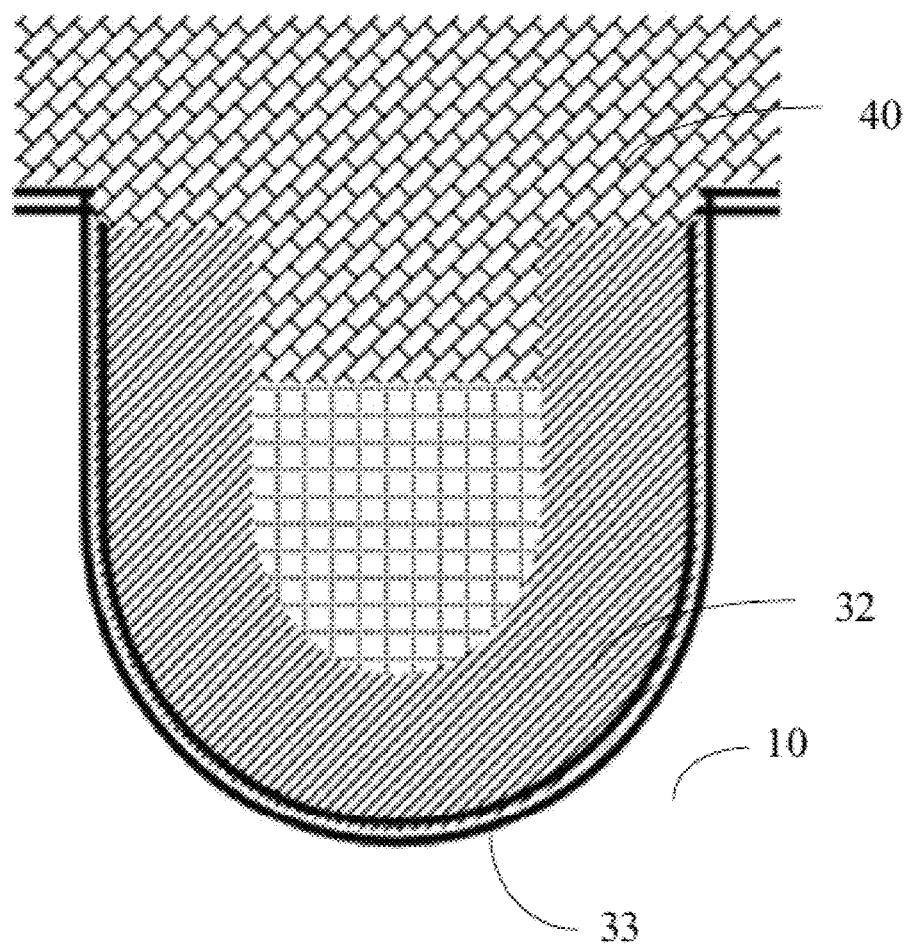

If the polysilicon is only deposited in the trench, or the polysilicon outside the trench is removed, the cross-sectional view of the device after step S330 is shown in FIG. 4d. A layer of insulating dielectric 40 can be directly deposited (the insulating dielectric 40 includes the lower portion with a checkerboard filling pattern). However, as aforementioned, to reduce the cost in the illustrated embodiment, the polysilicon is directly deposited without increasing the cost of polysilicon mask layers. Therefore, the step S330 in the illustrated embodiment specifically includes following sub-steps:

S332, the insulating dielectric is deposited in the trench.

A thickness of the deposited insulting dielectric is guaranteed to be enough to fill up the trench. In the illustrated embodiments, the second dielectric layer 41 is a silicon dioxide layer deposited using tetraethyl orthosilicate (TEOS) as a reactant, the cross-sectional view of the device after step S332 is shown in FIG. 4a. In other embodiments, the insulating dielectric can be other insulating materials, such as phosphosilicate glass (PSG)/boron-doped phosphosilicate glass (BPSG), silicon oxynitride, silicon nitride, and the like.

S334, the insulating dielectric that overflows the trench is etched back, and the insulating dielectric on the substrate and the polysilicon outside the trench is removed.

Dry etching or wet etching can be used. It is necessary to guarantee that the insulating dielectric deposited on the substrate and polysilicon outside of the trench is completely removed and the underlying polysilicon layer 32 is exposed. However, it is also necessary to ensure that a sufficient amount of insulating dielectric is remained in an opening of the trench, so as to protect the polysilicon layer 32 during etching back in the step S336. The cross-sectional view of the device after step S334 is shown in FIG. 4b.

S336, the polysilicon is etched back to remove the polysilicon on the substrate outside the trench, thus an active area is exposed.

After exposing the active area, the active area of the device is manufactured. An active area manufacturing process known in the art can be used, and since the manufacturing process is not only irrelevant to the features of present disclosure, but also irrelevant to the trench gate lead-out structure, it will not be described herein. The cross-sectional view of the device after step S336 is shown in FIG. 4c.

Since the polysilicon layer in the trench is relatively thin (the trench is not filled up with the polysilicon, but only a layer of polysilicon is covering its inner wall), during etching back in step S336, the polysilicon layer 32 will be heavily etched (and even the underlying oxide gate layer 33 will be damaged). The second dielectric layer 41 mainly serves as a blocking layer when the polysilicon is etched, so as to guarantee that during the polysilicon etching, the polysilicon layer 32 in the trench is protected by the second dielectric layer 41 and the underlying polysilicon is not etched.

S338, the insulating dielectric is deposited again on the substrate, the residual polysilicon and the insulating dielectric.

After the active area is manufactured, the insulating dielectric is deposited again on the substrate 10, the residual polysilicon 32 and the insulating dielectric 41. The thickness of the deposited insulting dielectric is guaranteed to be enough to fill up the opening of the trench. The insulating dielectric deposited in step S338 can be the same material as the insulating dielectric in step S332, or can be a different material, subsequently, the deposited insulating dielectric can serve as an interlayer dielectric (ILD). In the illustrated embodiment, the insulating dielectric is deposited twice (in step S332 and S338), therefore two different filling patterns are used in FIG. 4 in order to distinguish.

Figure 5:
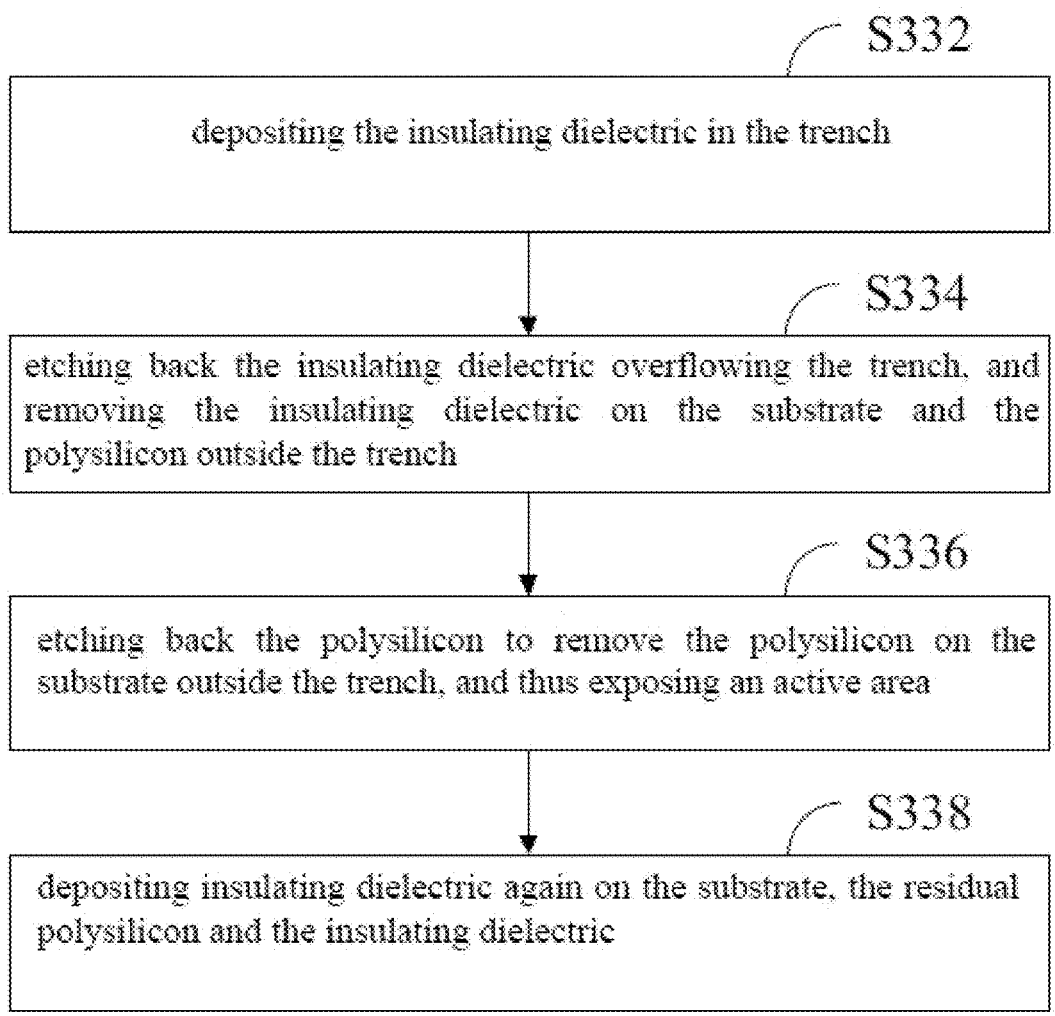
FIG. 5 is a flow chart of sub-steps of step S330 according to an embodiment.

The insulating dielectric is deposited according to the method shown in FIG. 5, therefore no photoetching is required in the steps S320, S332, S334, S336, and S338, no extra polysilicon photoetching layer is required and no corresponding mask is needed, and therefore the cost is saved.

S340, the insulating dielectric is photoetched and etched to form a dielectric hole, the insulating dielectric is divided into a first dielectric layer and a second dielectric layer.

Figure 6:
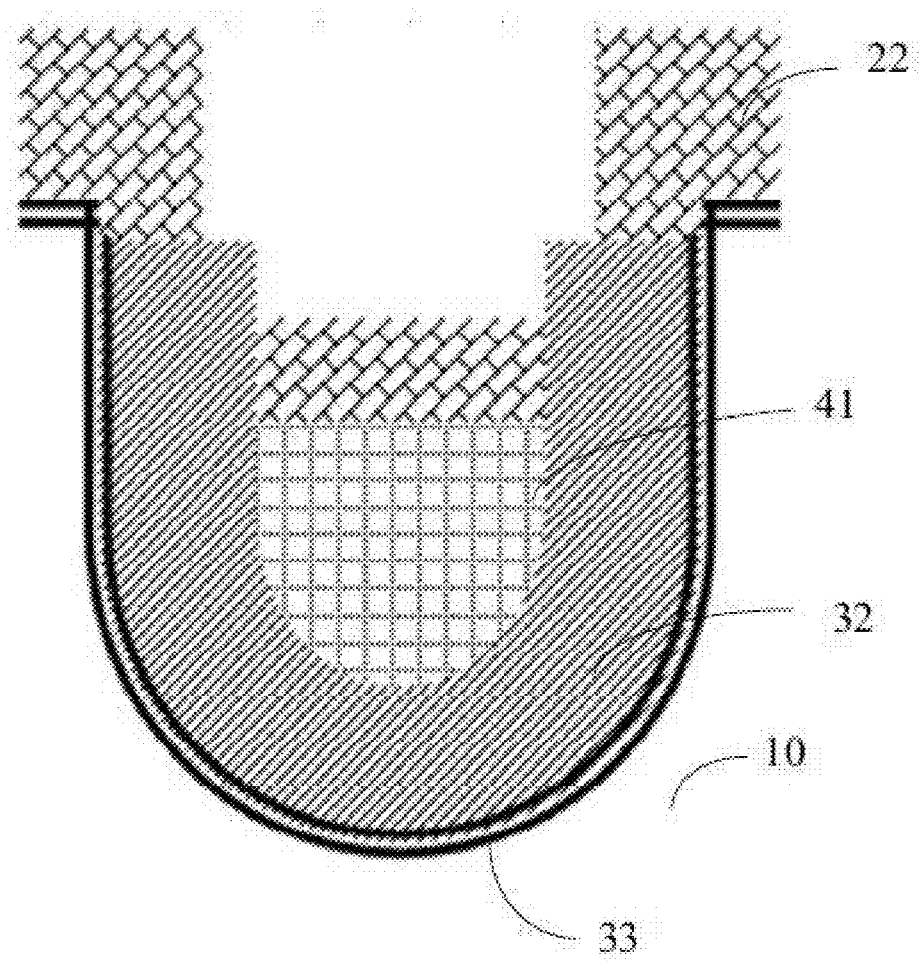
FIG. 6 is a cross-sectional view of a device after step S340 is completed.

The dielectric hole is required to have a certain over etch to guarantee that the polysilicon layer 32 on the side wall of the trench is exposed. The cross-sectional view of the device after step S340 is shown in FIG. 6, the insulating dielectric 40 is divided into the first dielectric layer 22 on the substrate 10 and the second dielectric layer 41 filled in the recess formed on the surface of the polysilicon layer 32 by the dielectric hole.

S350, a contact hole etch is performed, and a gap is formed between the second dielectric layer and the polysilicon on both sides thereof.

Figure 7:
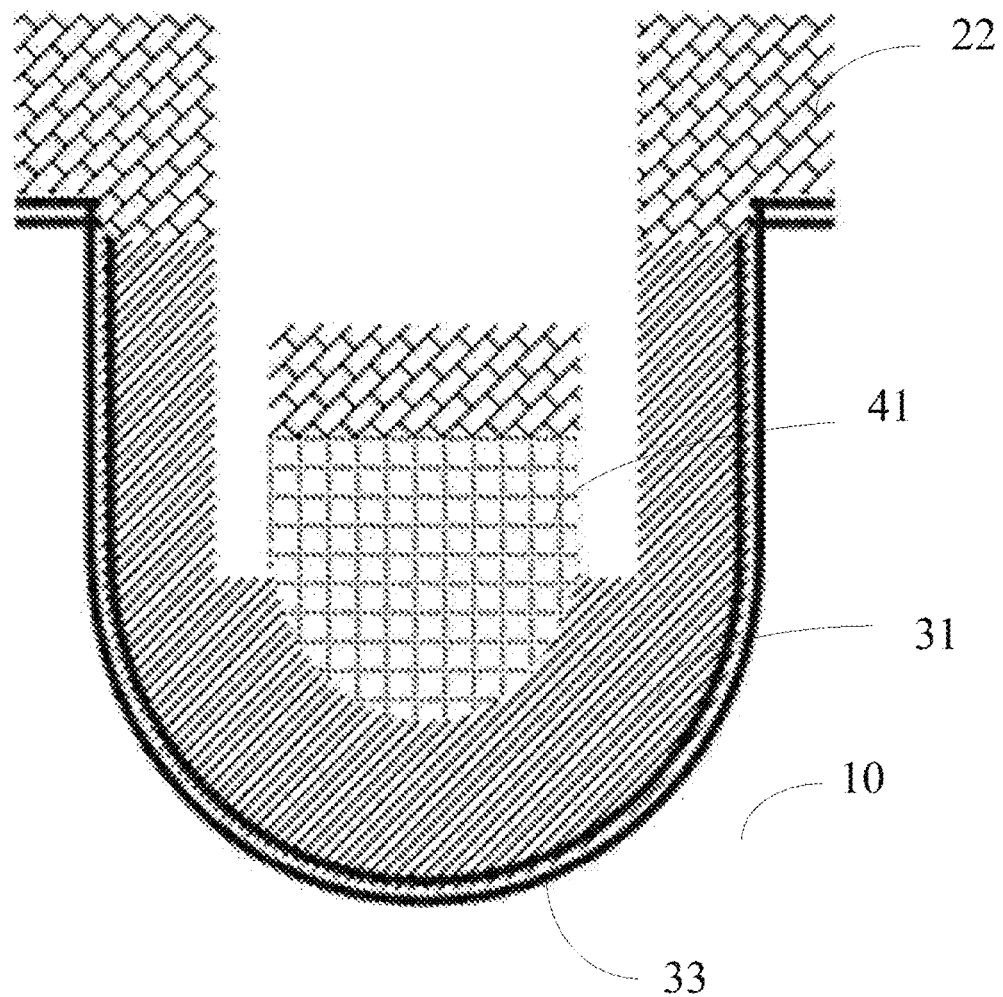
FIG. 7 is a cross-sectional view of a device after step S350 is completed.

The polysilicon surrounding the second dielectric layer 41 is partially removed via etching the polysilicon, and a polysilicon gate 31 is formed, as shown in FIG. 7.

S360, a contact hole filling is performed to fill a metal into the dielectric hole and the gap, and a metal plug connected to the polysilicon gate is formed.

Referring to FIG. 1, in one of the embodiments, the metal plug 50 is a tungsten plug. In other embodiments, other metals known in prior art can also be used to fill the contact hole.

In the illustrated embodiment, after the metal is completely filled, the metal plug is required to be etched back and the surface of the device is required to be planarized.

The aforementioned method of manufacturing a trench gate lead-out structure is particularly suitable for a DMOS device (including VDMOS and LDMOS). It is to be understood that the method of manufacturing is also suitable for other semiconductor devices.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A trench gate lead-out structure, comprising:
   a substrate;
   a trench located on a surface of the substrate;
   a first dielectric layer located on the substrate;
   a gate oxide layer located on an inner surface of the trench;
   a polysilicon gate located on the gate oxide layer, wherein the trench is partially filled with the polysilicon gate, such that a recess is formed on a surface of the polysilicon gate;
   a second dielectric layer filled in the recess; and
   a metal plug extending downwardly through the first dielectric layer and being inserted between the second dielectric layer and the polysilicon gate, such that the metal plug is connected to the polysilicon gate.

2. The trench gate lead-out structure according to claim 1, wherein the second dielectric layer is a silicon dioxide layer deposited using tetraethyl orthosilicate as a reactant.

3. The trench gate lead-out structure according to claim 1, wherein the metal plug is a tungsten plug.

4. The trench gate lead-out structure according to claim 1, wherein the trench gate lead-out structure is applied to a vertically double diffused metal-oxide-semiconductor field-effect transistor or a laterally double diffused metal-oxide-semiconductor field-effect transistor.

5. The trench gate lead-out structure according to claim 1, wherein the polysilicon gate in the trench has a cross-section of a U-shaped structure, and the second dielectric layer is filled in a concave hollow portion of the U-shaped structure.

6. A method of manufacturing a trench gate lead-out structure, comprising:
   forming a trench on a surface of a substrate;
   forming a gate oxide layer on an inner surface of the trench;
   filling the inner surface of the trench with polysilicon without completely filling up the trench, forming a recess on a surface of the polysilicon in the trench;
   forming an insulating dielectric on the substrate and the trench;

photoetching and etching the insulating dielectric to form a dielectric hole, thereby exposing the polysilicon of a side wall of the trench, and dividing the insulating dielectric into a first dielectric layer on the substrate and a second dielectric layer in the trench;

performing a contact hole etch to partially remove the polysilicon surrounding the second dielectric layer, and forming a gap between the second dielectric layer and the polysilicon on both sides thereof; and performing a contact hole filling to fill a metal into the dielectric hole and the gap, and forming a metal plug connected to a polysilicon gate.

7. The method according to claim 6, wherein the step of forming an insulating dielectric on the substrate and the trench comprises:

depositing the insulating dielectric in the trench;

etching back the insulating dielectric that overflows the trench, and removing the insulating dielectric on the substrate and the polysilicon outside the trench;

etching back the polysilicon to remove the polysilicon on the substrate outside the trench, thus exposing an active area; and depositing insulating dielectric again on the substrate, the residual polysilicon, and the insulating dielectric.

8. The method according to claim 7, wherein the step of depositing the insulating dielectric in the trench is performed by chemical vapor deposition of a silicon dioxide layer using tetraethyl orthosilicate as a reactant.

9. The method according to claim 6, wherein the step of photoetching and etching the insulating dielectric is performed via over-etching the insulating medium to ensure the exposure of the polysilicon.

10. The method according to claim 6, wherein after the step of performing a contact hole filling, the method further comprises a step of performing a planarization process.

* * * * *